United States Patent
Kappler

(10) Patent No.: US 8,623,232 B2
(45) Date of Patent: Jan. 7, 2014

(54) METHOD AND DEVICE FOR TREATING SILICON WAFERS

(75) Inventor: Heinz Kappler, Dornstetten-Aach (DE)

(73) Assignee: Gebr. Schmid GmbH & Co. (DE)

( * ) Notice: Subject to any disclaimer, the term of this patent is extended or adjusted under 35 U.S.C. 154(b) by 233 days.

(21) Appl. No.: 12/818,853

(22) Filed: Jun. 18, 2010

(65) Prior Publication Data

US 2010/0311247 A1 Dec. 9, 2010

Related U.S. Application Data

(63) Continuation of application No. PCT/EP2008/010894, filed on Dec. 18, 2008.

(30) Foreign Application Priority Data

Dec. 19, 2007 (DE) .......................... 10 2007 063 202

(51) Int. Cl.
*C03C 15/00* (2006.01)
*C03C 25/68* (2006.01)

(52) U.S. Cl.
USPC .............................................. 216/92; 216/83

(58) Field of Classification Search
None
See application file for complete search history.

(56) References Cited

U.S. PATENT DOCUMENTS

| 5,297,568 | A | 3/1994 | Schmid |
| 5,753,135 | A | 5/1998 | Jablonsky |
| 2004/0074601 | A1* | 4/2004 | Lee et al. .................. 156/345.21 |
| 2004/0222323 | A1* | 11/2004 | Akasaka et al. ............... 239/565 |
| 2006/0068597 | A1* | 3/2006 | Hauser et al. .................. 438/753 |
| 2006/0154490 | A1 | 7/2006 | Narabayashi et al. |
| 2007/0246085 | A1* | 10/2007 | Wakatsuki et al. .......... 134/95.3 |
| 2007/0267387 | A1* | 11/2007 | Koyata et al. .................... 216/88 |
| 2008/0041526 | A1* | 2/2008 | Pass .......................... 156/345.31 |
| 2008/0296262 | A1 | 12/2008 | Muller et al. |
| 2008/0311298 | A1 | 12/2008 | Kappler |
| 2009/0032492 | A1 | 2/2009 | Kunze-Concewitz |

FOREIGN PATENT DOCUMENTS

| DE | 20304601 U1 | 6/2003 |
| DE | 102 25 848 A1 | 12/2003 |
| EP | 0 836 370 A1 | 4/1998 |
| JP | 2001-210615 A | 8/2001 |
| JP | 2005-136081 A | 5/2005 |
| JP | 2006-196783 A | 7/2006 |
| JP | 2006-294696 A | 10/2006 |
| WO | 98/17483 A1 | 4/1998 |
| WO | 2005/013342 A1 | 2/2005 |
| WO | WO 2007073886 A1 * | 7/2007 |

OTHER PUBLICATIONS

Machine translation of WO2007/073886A1.*

(Continued)

*Primary Examiner* — Shamim Ahmed
*Assistant Examiner* — Bradford Gates
(74) *Attorney, Agent, or Firm* — Akerman LLP

(57) ABSTRACT

A method and device for treating silicon wafers. In a first step, the silicon wafers (22) are conveyed flat along a continuous, horizontal conveyor belt (12, 32) and nozzles (20) or the like spray an etching solution (21) from the top onto the wafers to texture them, only little etching solution (21) being applied to the silicon wafers (22) from below. In a second step, the silicon wafers (22), which are aligned as in the first step, are wetted exclusively from below with the etching solution (35) to etch-polish them.

13 Claims, 2 Drawing Sheets

(56) References Cited

OTHER PUBLICATIONS

"First Office Action," State Intellectual Property Office, P.R. China, in Chinese Patent Application No. 200880127394.X; Document of 8 pages, dated Oct. 9, 2011.

English Translation of "First Office Action," State Intellectual Property Office, P.R. China, in Chinese Patent Application No. 200880127394.X; Document of 8 pages, dated Oct. 9, 2011.

Request for Opposition in corresponding European patent application No. 08861689.1.

Hauser, A., "Die kristalline Siliziumsolarzelle Untersuchung der Einzelprozesse und Entwicklung von Alternatvien", Dissertation, Universitat Konstanz, 2006.

Kray, D., "Hocheffiziente Solarzellenstrukturen fur kristllines Silicium-Material industrieller Qualitat", Dissertation, Universitat Konstanz, 2004.

Warta, W. et al., "Highly Efficient 115-um-thick Solar Cells on Industrial Czochralski Silicon", Progress in Photovoltaics: Research and Applications, 2000, vol. 8, pp. 465-471.

English Translation of Office Action issued in Japanese Patent Application No. 2010-538475.

* cited by examiner

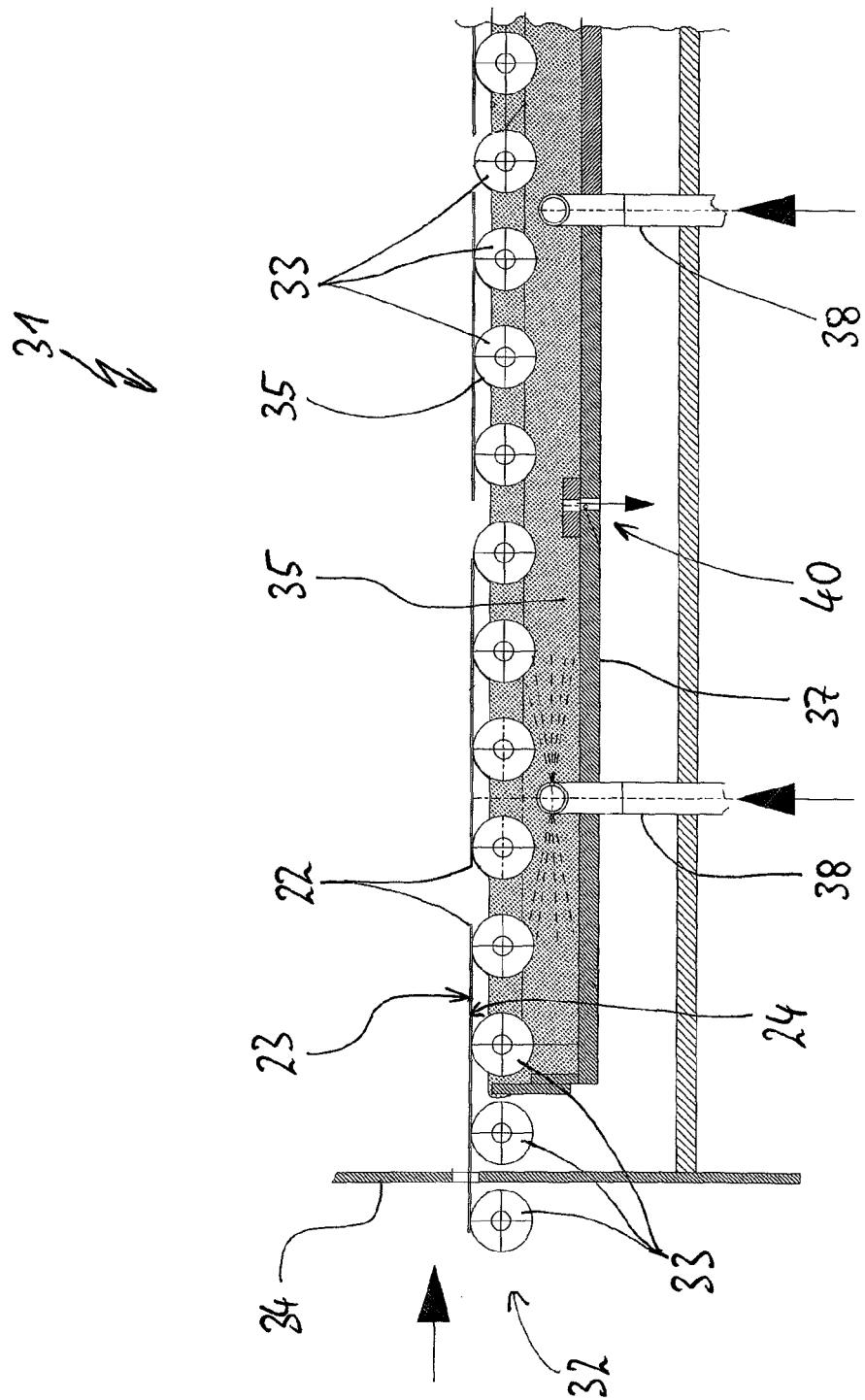

METHOD AND DEVICE FOR TREATING SILICON WAFERS

FIELD OF APPLICATION AND PRIOR ART

The invention relates to a method and also a device for treating silicon wafers, in particular for texturing and polish-etching with etching solution.

It has been known practice hitherto to etch away approximately 5 μm from silicon wafers using etching solution from both sides of the silicon wafers. It is thereby possible, firstly, to eliminate sawing damage. Furthermore, it is possible to produce a textured top side, which is significant for the performance of the solar cell produced from the silicon wafer. Furthermore, the underside should be as smooth and lustrous as possible in order that light which has passed through is reflected and its energy can be utilized in the course of return travel.

OBJECT AND HOW IT IS ACHIEVED

The invention is based on the object of providing a method mentioned in the introduction and also a device mentioned in the introduction for carrying out the method with which problems in the prior art can be solved and, in particular, an advantageous further development is possible and also improved and efficient etching of the silicon wafers.

This object is achieved by means of a method of treating silicon wafers, the method comprising the steps of transporting the silicon wafers in a horizontal position along a horizontal transport path. The texturing etching solution for texturing the silicon wafers is applied or sprayed on from above during transport by means of nozzles or the like, while little or no texturing etching solution is applied to the silicon wafers from below. In a second method step, the silicon wafers, with the same orientation as in the first method step, are wetted with a polish etching solution for polish-etching from below. The object is also achieved by a device for carrying out the method. The device has a texturing module for texturing the silicon wafers by applying or spraying on said texturing etching solution from above onto said top side of the silicon wafers. The device also has a horizontal transport path with tranport rollers or the like, and also nozzles or the like for applying or spraying the texturing etching solution. Advantageous and preferred embodiments of the invention are explained in greater detail below. Although some features of the device are described principally in connection with the method, they simultaneously serve for elucidating the device and are generally applicable thereto. Furthermore, the wording of the priority application DE 102007063202.0 of Dec. 19, 2007 in the name of the same applicant is incorporated by express reference in the content of the present description. The wording of the claims is incorporated by express reference in the content of the description.

According to the invention, it is provided that, in a first method step, the silicon wafers are transported in a horizontal position, to be precise along a horizontal transport path. Etching solution for texturing is applied or sprayed on from above, for which purpose nozzles, surge pipes or the like can be used, which are known per se for such a purpose. From below the silicon wafers, either no liquid at all or only little liquid is applied to the silicon wafers or the underside thereof in this method step. At all events, no etching liquid is sprayed on or the like from the underside. For this purpose, a device embodied in a correspondingly suitable manner can have, above the transport path, said nozzles or surge pipes or the like for wetting the top side. Below the underside, such nozzles or the like are not provided at all.

In a later or second method step, the silicon wafers, in the same way or with the same orientation as in the first method step, in a horizontal position on the transport path, are wetted with etching solution for polish-etching from below. Advantageously, in this case the etching solution is actually applied exclusively from below and also exclusively to the underside. This is because precisely if transport rollers or the like are used for the transport path, in the first method step some etching solution from above can also pass onto said transport rollers and then be transferred to the underside of the silicon wafers by the transport rollers. Since this is a manageable amount, however, the etching effect can remain very small here. It can even be advantageous, for example in preparation for the second method step.

In this way, approximately 4 μm to 6 μm of material, preferably approximately 5 μm, can be removed in a first method step for eliminating the sawing damage and for texturing the top side. The method duration can here be approximately 80 to 120 seconds. In this case, the silicon wafers are advantageously moved in a continuous fashion or moved through a corresponding texturing module on the transport path.

In the first method step, approximately 2 μm of material is removed or etched away on the underside. As a result, here as well, a portion of the sawing damage has already been eliminated, while surface texturing, which is undesired here, has not yet taken place correctly. After the method step of texturing, the silicon wafers can be rinsed, advantageously with water.

The etching solution used for the first method step can be a customary etching solution for texturing, preferably comprising a mixture of HF and $HNO_3$. In the first method step or when the latter is carried out in the texturing module, etching solution for texturing can be applied in a plurality of regions successively along the transport path. For this purpose, a plurality of groups of nozzles or the like for spraying on the etching solution are advantageously provided successively, advantageously on surge pipes or the like running transversely with respect to the transport path. This, too, is known in principle.

The texturing module is advantageously provided with a collecting trough below the transport path, such that etching solution that runs away can be collected and reused. Said rinsing of the silicon wafers after wetting with etching solution in the first method step in the texturing module is advantageously effected in said texturing module, particularly advantageously at the end thereof. A section of the texturing module can be embodied for rinsing with water, wherein a collecting trough is provided here separately from the collecting trough for etching solution, for the purpose of separating the two liquids in order that a reduced cleaning outlay arises. The intensity of rinsing with water on the silicon wafers, that is to say the amount of water, can be considerably greater than that for wetting with etching solution.

Advantageously, the silicon wafers move after the first method step or from the texturing module directly to the next or second method step, which takes place in a polish-etching module. Here etching solution for polish-etching is applied, wherein the silicon wafers are in any event transported in a continuous fashion on a transport path through the polish-etching module. The silicon wafers are wetted exclusively at their underside. This can be effected, in one instance, by slight spraying from below. A method and also a device in the polish-etching module in accordance with DE 10 2005 062

528 A1, to which reference is explicitly made, are advantageously used for this purpose. In this case, transport rollers for the silicon wafers are for the most part immersed in a bath containing the etching solution for polish-etching. Upon rotation, etching solution adheres to a top side and is then brought to the undersides of the silicon wafers, where it performs the polish-etching. An etching removal 3 μm to 10 μm can thus be achieved at the underside, thereby very good polish-etching is actually possible with a very good result with regard to a smooth and lustrous rear side. This method step can here last somewhat longer than in the preceding method step, and in particular can last approximately 200 seconds. Here as well, the etching removal can be determined by the method duration. The etching solution used for polish-etching is one similar to that used during texturing, although with a larger $HNO_3$ proportion. The etching processes can be carried out at room temperature, a temperature range extending from approximately 4° C. to approximately 40° C.

These and further features emerge not only from the claims but also from the description and the drawings, wherein the individual features can be realized in each case by themselves or as a plurality in the form of subcombination in an embodiment of the invention and in other fields and can constitute advantageous and inherently protectable embodiments for which protection is claimed here. The subdivision of the application into individual sections and sub-headings do not restrict the general validity of the statements made thereunder.

BRIEF DESCRIPTION OF THE DRAWINGS

An exemplary embodiment of the invention is illustrated schematically in the drawings and is explained in greater detail below. In the drawings:

FIG. 2 shows a schematic illustration of a further device for polish-etching silicon wafers by wetting by means of transport rollers from below.

DETAILED DESCRIPTION OF THE EXEMPLARY EMBODIMENT

Figure 1:
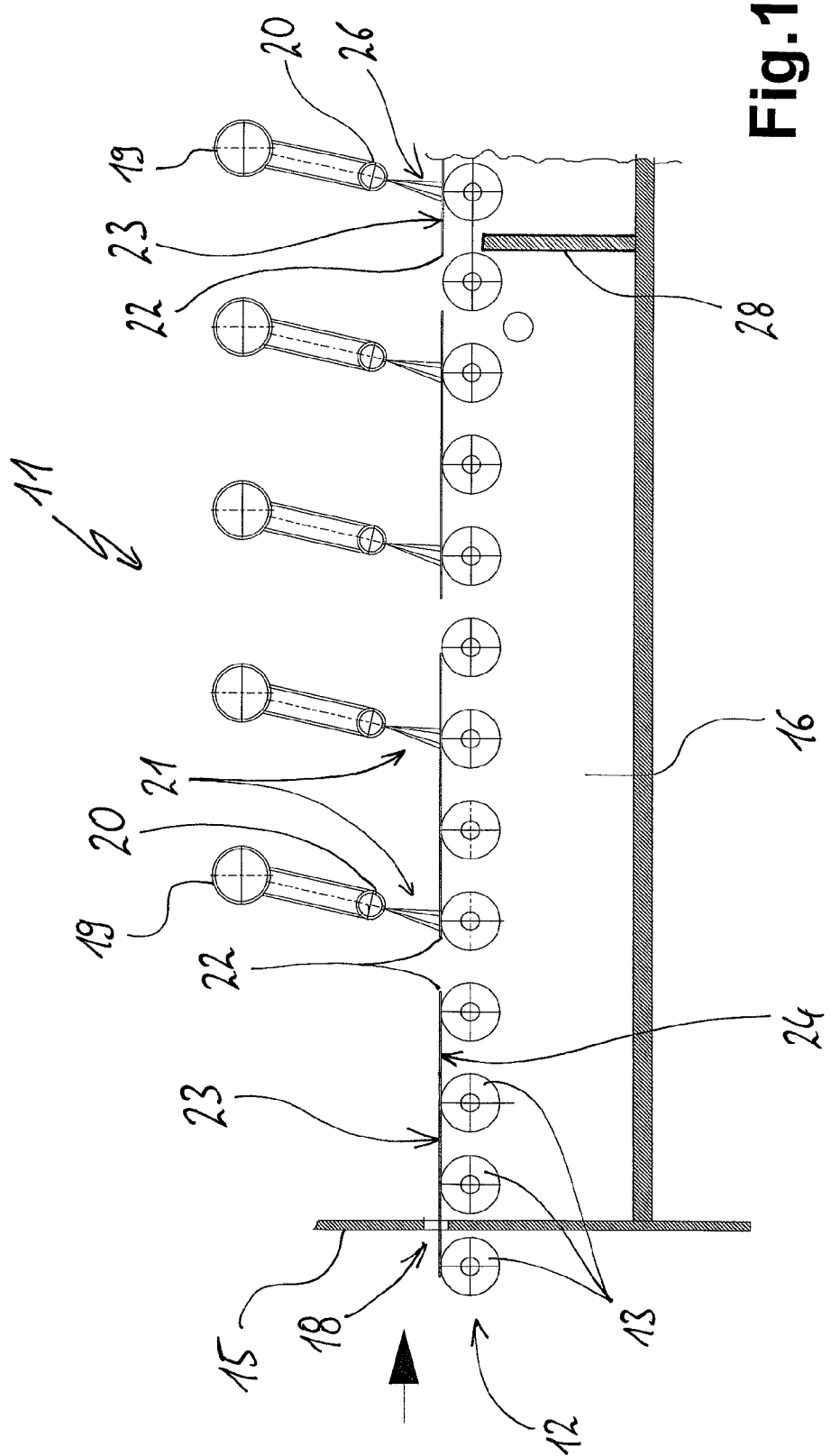
FIG. 1 shows a schematic illustration of a device for texturing by spraying silicon wafers from above.

FIG. 1 illustrates a texturing module 11 with a transport path 12, which is formed by a plurality of transport rollers 13 in a conventional manner. The texturing module 11 has a housing 15 containing a collecting trough 16, and from the left an inlet 18 at the transport path 12.

Above the collecting trough 16 and the transport path 12, a plurality of surge pipes 19 are provided parallel to one another, which surge pipes can run transversely with respect to the transport path 12. They have downwardly directed nozzles 20 which output etching solution 21. Said nozzles 20 are also known per se to the person skilled in the art. They can be rigidly aligned or else movable. Furthermore, the nozzle 20 can also, under certain circumstances, be activatable individually or in groups in order to achieve a specific profile of the discharge of the etching solution 21.

Silicon wafers 22 are transported on the transport rollers 13 in a horizontal position along the transport path 12. The top sides 23 later form the front sides of solar cells, and the undersides 24 bearing on the transport rollers 13 form the rear sides of said solar cells.

As can be discerned from FIG. 1, etching solution 21 is discharged only onto the top sides 23 of the silicon wafers 22. Consequently, the texturing of the silicon wafers 22 or of the top sides 23 thereof is principally effected here in the first method step. In this case, it is clear, of course, that a certain amount of etching solution 21 overflows in particular over the front edges and their edges of the silicon wafers 22 and is then situated on the transport rollers 13. Subsequent silicon wafers 22 lying on the transport rollers 13 are then wetted with this etching solution 21 on their underside 24 as well. However, the amount of etching solution 21 is considerably smaller here, such that considerably less etching is effected as well. Since, however, as is illustrated, the targeted application of the etching solution 21 from above is effected by means of the nozzles 20, this is referred to as applying etching solution from above within the meaning of the invention.

It is possible to establish whether the nozzles 20 are, for example, arranged above the transport rollers 13 or oriented toward the latter, such that etching solution 21 is applied to the transport rollers 13 if there is not actually a silicon wafer 22 underneath, which intensifies the wetting of the undersides 24 of the next silicon wafers 22 with etching solution 21. If the nozzles 20 are arranged or oriented differently, this effect is considerably weaker. Furthermore, this effect of etching at the underside can also be influenced by the targeted driving of the nozzles 20 or by a targeted discharge of the etching solution 21 onto the top sides 23 of the silicon wafers 22.

In the texturing module 11 continued toward the right, the nozzle 20 illustrated on the far right can be designed not to output etching solution 21, but rather water or rinsing water 26. Etching solution 21 can thereby be cleaned from the silicon wafer 22 in this region for its top side 23. The separator 28 is provided for this purpose in the collecting trough 16, such that etching solution 21 that has dipped away is situated to the left of said separator and the rinsing water 26 admixed with a small proportion of etching solution is situated to the right of said separator. The number of successive surge pipes 19 with nozzles 20 for applying etching solution 21 can vary and be varied in accordance with the desired transport speed and method duration. Likewise, it is advantageously possible to provide a plurality of nozzles 20 for rinsing water 26 for rinsing the silicon wafers 22.

FIG. 2 illustrates a polish-etching module 31. The latter also has a transport path 32, which is the continuation of the transport path 12 from FIG. 1. Likewise, the polish-etching module 31 is advantageously provided and installed relatively directly in succession with respect to the texturing module 11. The transport path 32 is formed by transport rollers 33. For a detailed description of the polish-etching module 31, reference is primarily made to DE 10 2005 062 528 A1, which describes in detail how the etching solution 35 for polish-etching is brought from the bath 37 to the undersides 24 of the silicon wafers 22 by means of the transport rollers 33. They serve, therefore, for transporting the wafers and for wetting the underside thereof. The etching solution 35 for polish-etching is as described above. It can also be discerned from the illustration of FIG. 2 that, in the second method step, no etching solution 35 whatsoever can pass onto the top side 23 of the silicon wafers 22, but rather only to the undersides 24. As can be seen in FIG. 2, the etching solution bath level can be between a center diameter level and a top level of the rollers.

The bath 37 has an outlet 40 between two supply pipes 38, which introduce new etching solution 35 into the bath 37. Said outlet, in addition to the lateral overflow over the edge of the bath 37, ensures that etching solution 35 is exchanged in such a way that not only in the region of the exit of the supply pipes 38 is there fresh etching solution 35, but the latter is also moved in the direction of the outlet 40 and, therefore, there as well can be brought to the undersides 24 of the silicon wafers 22 by the transport rollers 33. In the method sequence of the treatment of the silicon wafers 22, the polish-etching in the polish-etching module 31 is also followed by further rinsing, advantageously once again with water.

The polish-etching module 31 is also provided in a housing 34. Extraction of vapors of the etching solutions can be provided, of course, in both modules.

The substrates are typically flat, planar silicon wafers 22 having a round contour with a diameter of approximately 60 mm to 250 mm or a rectangular contour with edge length of 60 mm to 250 mm. A preferred thickness lies in the range of 0.1 mm to 2 mm.

The invention claimed is:

1. A method for treating silicon wafers, the method comprising the steps of:
   transporting said silicon wafers in a horizontal position along a horizontal transport path;
   applying texturing etching solution on a top side of said silicon wafers only from above during said transport by means of a texturing etching solution applying nozzle arranged above said horizontal transport path, for texturing etching said top side in a first method step; and
   wetting, in a second method step, an underside of said silicon wafers, with a same orientation as in said first method step, while not said top side with a polish etching solution from below for polish-etching said underside while not said top side, said polish-etching solution having a higher proportion of $HNO_3$ than said texturing etching solution.

2. The method as claimed in claim 1, wherein rinsing is effected between said first method step of texturing and said second method step of polish-etching.

3. The method as claimed in claim 2, wherein said rinsing is effected with water.

4. The method as claimed in claim 1, wherein in said first method step for texturing, approximately 4 µm to 6 µM of material are removed at said top side and 1 µm to 3 µm are removed at said underside.

5. The method as claimed in claim 4, wherein said amount removed from said top side is more than double said amount removed from said underside.

6. The method as claimed in claim 1, wherein said first method step lasts for approximately 80 seconds to 120 seconds, wherein said silicon wafers are transported further in a continuous fashion.

7. The method as claimed in claim 1, wherein in said first method step, said texturing etching solution for texturing is applied in a plurality of regions successively along said transport path of said silicon wafers.

8. The method as claimed in claim 7, wherein said texturing etching solution for texturing is applied by means of a plurality of surge pipes together with nozzles running transversely with respect to the transport path.

9. The method as claimed in claim 1, wherein in said second method step, said polish etching solution for polish-etching is applied with a continuous passage of said silicon wafers.

10. The method as claimed in claim 9, wherein said wetting with said polish etching solution for said polish-etching is effected by means of transport rollers for said silicon wafers, wherein said transport rollers are partly immersed in a bath containing transport rollers and said polish etching solution such that the bath level is between a center diameter level and a top level of said rollers to have a surface of said transport rollers bringing said polish etching solution to said underside of said silicon wafers.

11. The method as claimed in claim 9, wherein a duration of said second method step for said polish-etching is approximately 200 seconds.

12. The method as claimed in claim 1, wherein said polish etching solution and said texturing etching solution both comprise a mixture of HF and $HNO_3$, wherein said $HNO_3$ proportion is greater in said polish etching solution than in said texturing etching solution.

13. The method as claimed in claim 1, wherein the first method step is carried out by a texturing module and the second method step is carried out by a polish-etching module arranged downstream of said texturing module in a transport direction.

* * * * *